United States Patent
Hilton et al.

(10) Patent No.: US 7,467,264 B2
(45) Date of Patent: Dec. 16, 2008

(54) METHODS AND APPARATUSES FOR DETERMINING THE STATE OF A MEMORY ELEMENT

(75) Inventors: Richard L. Hilton, Boise, ID (US);
Anthony Holden, Boise, ID (US);
Steven C. Johnson, Eagle, ID (US);
David H. McIntyre, Boise, ID (US);
Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 861 days.

(21) Appl. No.: 10/607,624

(22) Filed: Jun. 27, 2003

(65) Prior Publication Data
US 2004/0268065 A1 Dec. 30, 2004

(51) Int. Cl.
*G06F 12/00* (2006.01)
*G11C 11/00* (2006.01)
*H03M 13/41* (2006.01)

(52) U.S. Cl. .................. 711/156; 365/148; 365/158

(58) Field of Classification Search .............. None
See application file for complete search history.

(56) References Cited

U.S. PATENT DOCUMENTS

| 6,317,376 | B1 * | 11/2001 | Tran et al. ............ 365/210 |
| 6,687,179 | B2 * | 2/2004 | Baker ................. 365/225.5 |
| 6,831,856 | B2 * | 12/2004 | Pashmakov ............ 365/163 |
| 2004/0240255 | A1 * | 12/2004 | Smith et al. ........... 365/158 |

OTHER PUBLICATIONS

Chih-Ling Lee; "A Study of Magnetoresistance Random-Access Memory" (pp. 1-16).
Jerry D. Gibson; "Principles of Digital and Analog Communications"; Second Edition, 1989 (pp. 364-366).

* cited by examiner

*Primary Examiner*—Denise Tran

(57) ABSTRACT

Methods and apparatuses are disclosed for measuring values of a plurality of memory elements, where the measured values may be indicative of the digital state of a memory element. Calculations may be performed on a plurality of transition-terms associated with the possible transitions in the values between proximate memory elements. The digital state of memory elements may be determined using the calculations performed on the plurality of transition-terms.

22 Claims, 6 Drawing Sheets

Measuring values associated with a plurality of memory elements, wherein the values are indicative of a digital state.
701

Calculating a plurality of terms associated with transitions in the values between memory elements wherein calculating includes calculating a sum of terms associated with transitions.
702

Determining the digital state of at least one memory element using the calculations from step 702 by determining the digital states of a memory word by choosing an outcome that minimizes the sum of transition-terms.
703

Measuring values associated with a plurality of memory elements, wherein the values are indicative of a digital state.
701

Calculating a plurality of terms associated with transitions in the values between memory elements wherein calculating includes calculating a sum of terms associated with transitions.
702

Determining the digital state of at least one memory element using the calculations from step 702 by determining the digital states of a memory word by choosing an outcome that minimizes the sum of transition-terms.
703

FIGURE 7

METHODS AND APPARATUSES FOR DETERMINING THE STATE OF A MEMORY ELEMENT

BACKGROUND

Memory devices are ubiquitous in the electronics industry. Memory devices may be implemented using arrays of magnetic elements that are constructed utilizing semiconductor processing techniques. The individual magnetic elements of the array may include materials with varying magnetic properties separated by an insulating layer. In this manner, the magnetic fields of the separated materials may be oriented in the same direction (termed "parallel"), or in an opposed orientation (termed "anti-parallel"). The electrical resistance of the magnetic elements may vary depending on the parallel or anti-parallel orientation of the magnetic fields. Digital information may be stored and retrieved by associating digital values (e.g., 1s and 0s) to the electrical resistance associated with the parallel and anti-parallel states.

To determine the resistance value of a memory element, which effectively determines the digital value contained therein, a voltage is typically developed across the memory element. Using this voltage, or alternately a current derived from this voltage, the resistance value of the memory element may be estimated. The digital value stored in the memory element thus may be determined from the measured resistance value.

Because memory elements are manufactured using semiconductor processing techniques, variations may develop across memory arrays due to processing inefficiencies, such as non-uniform deposition of materials during manufacturing. For example, insulating layers separating magnetic materials may vary in thickness across a wafer, resulting in memory elements within an array which have different resistive ranges for the same digital values. More specifically, processing inefficiencies that cause resistance fluctuations may cause inaccurate interpretation of the values stored in the memory array because it may be difficult to determine a resistance value corresponding to a binary '1' value, and a resistance value corresponding to a binary '0' value. Inaccurate interpretation of resistance may cause a binary '1' value to be interpreted as a binary '0', and vice-versa.

Accordingly, methods and apparatuses that improve the accuracy of determining memory element values are desirable.

SUMMARY

Methods and apparatuses are disclosed for measuring values of a plurality of memory elements, where the measured values may be indicative of the digital state of a memory element. Calculations may be performed on a plurality of transition-terms associated with the possible transitions in the values between proximate memory elements. The digital state of memory elements may be determined using the calculations performed on the plurality of transition-terms.

BRIEF DESCRIPTION OF THE DRAWINGS

For a detailed description of various embodiments of the invention, reference will now be made to the accompanying drawings in which:

FIG. 7 shows a flowchart of method in a accordance with an embodiment of the present invention.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ."

The term "couple" or "couples" is intended to mean either an indirect or direct electrical connection. Thus, if a first device couples to a second device, that connection may be through a direct electrical connection, or through an indirect electrical connection via other devices and connections. Also, the term "couple" or "couples" is also intended to refer to the situation in which a magnetic field emanating from a first material is induced in second material. For example, if a conductor carrying a current may emanate a magnetic field which may be coupled into a magnetic material.

In addition, the term "proximate" is intended to refer to memory elements that are within a range of each other, where measured values of the memory elements within this range correlate to each other. In this manner, proximate memory elements may be interpreted to include more memory elements than memory elements that are merely adjacent, and would encompass memory elements in the same region.

DETAILED DESCRIPTION OF THE EMBODIMENTS OF THE INVENTION

The following discussion is directed to various embodiments of the invention. Although one or more of these embodiments may be preferred, the embodiments disclosed should not be interpreted or otherwise used as limiting the scope of the disclosure, including the claims. In addition, one skilled in the art will understand that the following description has broad application, and the discussion of any embodiment is meant only to be exemplary, and not intended to intimate that the scope of the disclosure, including the claims, is limited to these embodiments. Further, it should be understood that the present invention may be implemented and practiced without including all of the components and steps described below.

Figure 1:
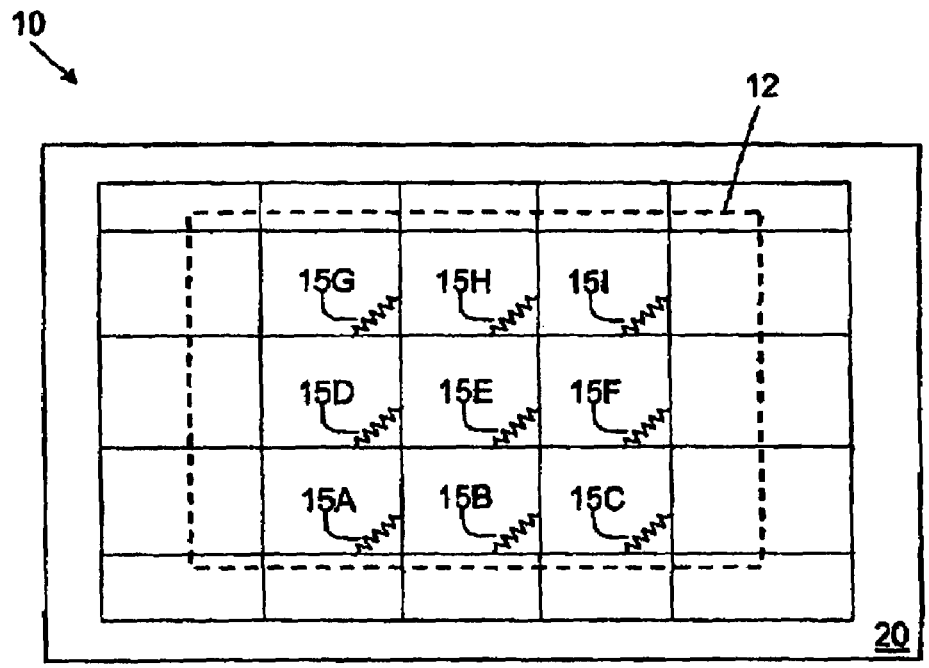
FIG. 1 shows a memory usable in accordance with various embodiments.

Referring to FIG. 1, a memory system 10 may include an array 12 of solid-state memory elements. The array 12 may include memory elements 15A-15I. Memory elements 15A-15I may comprise resistors; however, it should be noted that the solid-state memory elements may comprise other measurable electrical structures as would be familiar to one of ordinary skill in the art. For example, the solid-state memory elements 15A-15I may include capacitors, inductors, spin-tunnel junctions or other types of integrated circuit elements that facilitate the storage of data. Accompanying circuitry 20 may serve to write data to the array 12 and may also serve to read data from the array 12.

The memory 10 may be manufactured using semiconductor processing principles. Processing inefficiencies that cause non-uniformity across an array (e.g., resistive skew caused by non-uniform distribution of an insulating layer) may similarly affect proximate memory elements. Accordingly, the embodiments of the present invention may take advantage of similarities of proximate memory elements to determine the stored values in other local memory elements. The proximate memory elements surrounding the memory element to be read may be utilized in any order. The techniques disclosed herein also may be used to enhance the accuracy of memory transactions even in situations where processing inefficiencies are not a concern.

Adaptive Threshold Embodiments

Figure 2:
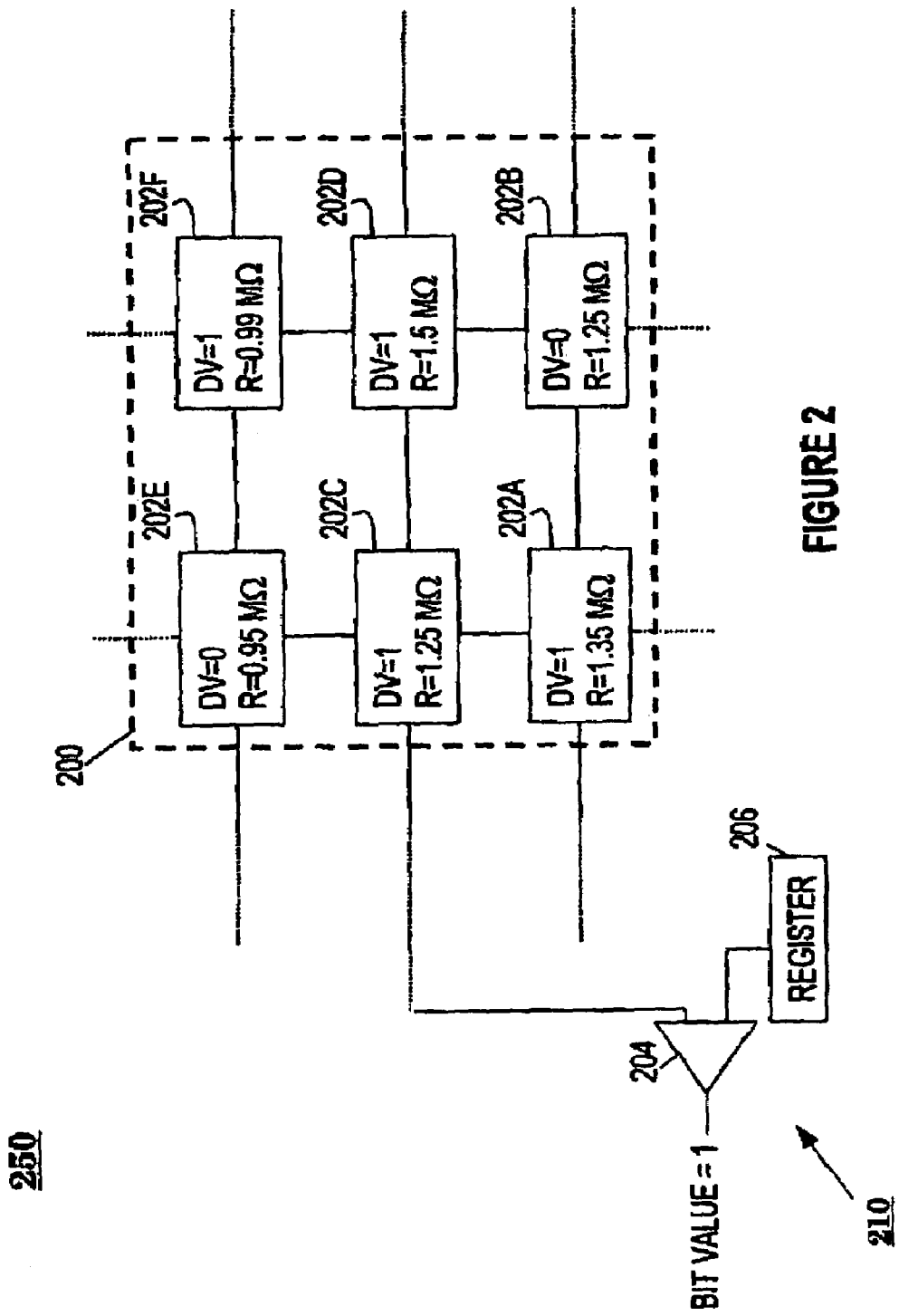
FIG. 2 shows an adaptive threshold example in accordance with various embodiments.

Some embodiments may employ adaptive threshold techniques to keep track of resistive values associated with each memory element while interpreting successive memory elements In the memory array. In this manner, measurements of proximate memory elements may be exploited to improve accuracy of subsequent measurements. FIG. 2 shows an illustrative example of a memory 250. The memory 250 includes a memory array 200 that comprises memory elements 202A-F, which may employ adaptive threshold embodiments. Note that the example depicted in FIG. 2 is meant to be merely illustrative and should not be construed as limiting in scope.

Each memory element 202A-F may contain a digital value (DV), that may be represented, for example by a resistance R. Because the array 200 may be constructed using semiconductor processing techniques, the resistance representing the digital value of one memory element may deviate from the resistance representing the same digital value in another memory element. This deviation is illustrated in FIG. 2 by the different resistive values shown for each memory element. In an embodiment, the memory 250 also includes circuitry 210 such as a comparison circuit 204 and a register 206. Accordingly when reading the digital value, the comparison circuit 204 may compare the memory element's resistive value to a predetermined threshold value contained in register 206, which may produce an output signal indicating the memory element's digital value.

Accordingly an adaptive threshold technique may be employed so that proximate resistive measurements may be used to dynamically update the threshold used in determining digital values. For example, register 206 may contain a digital representation of a resistive threshold value representing the average of the resistance measured from the last 4 memory elements which were a binary '1' value. This threshold may then be compared using comparison circuit 204 to subsequent memory element resistances to determine the digital value represented by the resistance for a binary '1' value. It should be noted that the digital values associated with a memory element may include more than a single bit. For example, magnetic memory elements 15A-15I in FIG. 1 may include more than two distinct resistance values, and therefore the memory elements may be capable of representing more than one single bit. In fact, these memory elements may have N distinct resistive values and an adaptive threshold may be assigned to each of the N distinct digital values. For example, if a memory element has four distinct resistances of 1M$\Omega$, 1.33M$\Omega$, 1.66M$\Omega$, and 2M$\Omega$, then four distinct digital values may be represented by this memory element. Also, register 206 may be either an analog or digital register and may be initiated by using a reference element. In this manner, the threshold by which subsequent memory elements are compared may be updated with each subsequent read, allowing proximate resistance shifts to be nullified.

Transition-Encoded Embodiments

Some embodiments capitalize on correlation in resistive values of proximate memory elements by encoding the data to be stored in memory (termed "data word") into a translated version of the data word (termed "code word"). The code word may be written to the memory elements instead of the data word. The code word may encode transitions between adjacent bits of the data word. Because each bit in the code word represents transitions between adjacent bits of a data word, proximate memory elements may be compared for decoding purposes, allowing resistive variations to be nullified. Decoding the code word from the proximate memory elements may then involve comparing proximate memory elements to determine if a transition in the original data word existed. Accordingly, by comparing proximate memory elements as part of decoding, correlation in resistive values of proximate memory elements may be exploited.

For example, a binary '1' in the data word may translate into transitions (e.g., a binary '0' followed by a binary '1' or a binary '1' followed by a binary '0') in the code word, and 0s in the data word may translate into the lack of a transition (e.g., a binary '0' followed by a binary '0' or a binary '1' followed by a binary '1') in the code word. Transitional-decoding may then be employed to decode the stored code word by comparing proximate memory elements. This transitional-decoding may be accomplished in a variety of ways including, without limitation, using an exclusive-OR (XOR) logic gate to detect differences in adjacent bits of the code word. Thus, in decoding the transitionally encoded data, variations between memory element resistances may be accounted for because proximate memory elements may be compared (thereby nullifying resistive variations) to determine the original data word.

Figure 3:
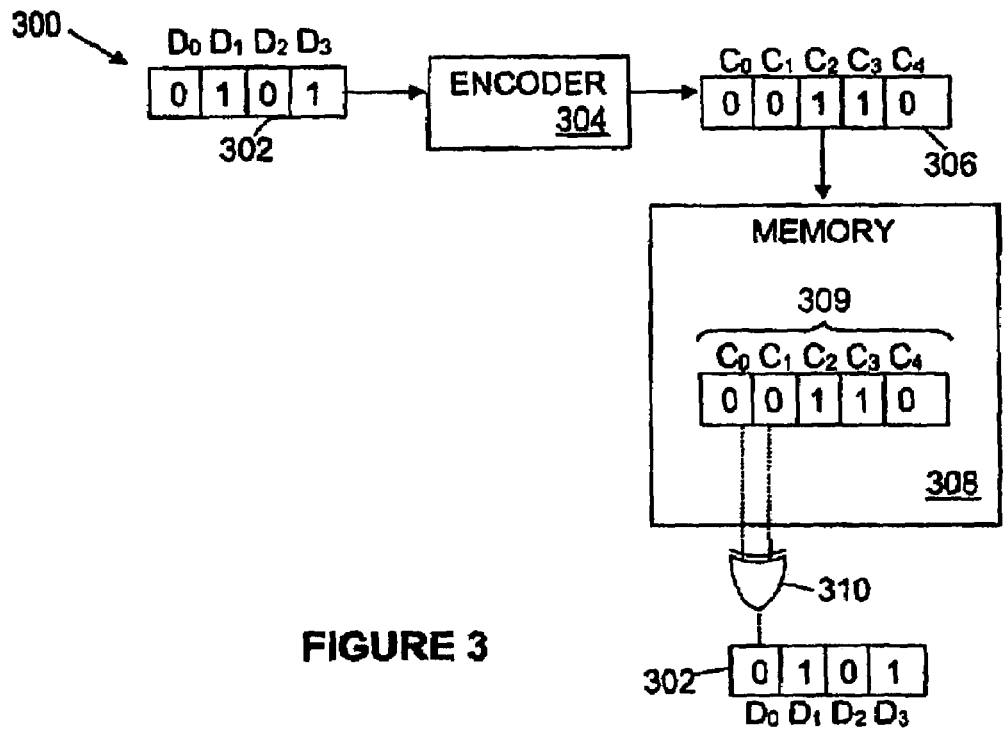
FIG. 3 shows an illustrative example in accordance with various embodiments.

FIG. 3 shows an example implementation of a transition-encoding/decoding process. Note that the transition-encoding system 300 of FIG. 3 is included only for illustrative purposes and should be considered as merely one of many possible transition-encoding embodiments encompassed by this disclosure. As shown, system 300 converts a data word 302 (comprising bits $D_0$-$D_3$ for purposes of illustration), into a code word 306 (comprising bits $C_0$-$C_4$) using encoder 304. The code word 306 then is stored in memory 308. In this example, the data word is 0101. The data word 302 may be encoded by encoder 304 into a code word 306. For encoding purposes, bit $C_0$ of the code word may be predefined—e.g., $C_0$=0 as shown—and used as point of reference for subsequently encoded bits. Accordingly, the bit $D_0$ in data word 302 may be compared to bit $C_0$ of code word 306. If the bits are the same (which is the case in this example), then bit $C_1$ may be assigned a binary '0' value, if the bits are different, then bit $C_1$ may be assigned a binary '1' value. Likewise, bit $C_2$ may be determined to be a binary '1' value because bits $C_1$ to bit $D_1$ differ in value. Subsequent bits of the code word 306 (i.e., bits $C_3$-$C_4$) may be similarly encoded as shown.

Code word 306 represents the values stored within proximate memory elements 309 of memory 308. In order to decode the code word 306 stored in the proximate memory elements 309, a comparison of bits $C_0$-$C_4$ retrieved from proximate memory elements 309 may be necessary. Because there may be a correlation between the resistive values of proximate memory elements 309, comparing them to each other while decoding may allow resistive variations to be nullified. FIG. 3 shows one possible method of comparing values retrieved from proximate memory elements 309 by using XOR logic 310, with truth table as shown in Table 1.

TABLE 1

| A | B | OUT |
|---|---|---|
| 0 | 0 | 0 |
| 0 | 1 | 1 |
| 1 | 0 | 1 |
| 1 | 1 | 0 |

Using the XOR logic 310, a binary '0' value may be determined for bit $D_0$ because bits $C_0$ and $C_1$ are the same binary value. Likewise, bit $D_1$ may be determined to be a binary '1' value because $C_1$ and $C_2$ are not the same binary value. Thus, by employing transition-encoding/decoding of the data, proximate memory elements (which may have a correlation between resistive values) may be compared to nullify resistive variations.

PREDICTIVE EMODIMENTS

As will be described below, some embodiments capitalize on a correlation that may exist between resistive values of proximate memory elements in determining the digital states of memory elements. The digital state of a particular memory element may be predicted by using calculations involving the measured resistances of proximate memory elements along with the measured resistance of the particular memory element. Differences between resistances of the particular memory element and the proximate memory elements can represent error terms that may be used in a predictive algorithm that predicts the actual digital value of the particular memory element. The predictive algorithm may use the error terms to indicate the probability of the various digital states represented in the particular memory elements, where the actual digital value may be associated with the digital state with the highest probable value. Accordingly, the error terms associated with the various states may be minimized to predict a digital state that is likely to exist in the particular memory element.

Predictive estimation algorithms may include the use of a Viterbi decoding algorithm to provide correlation information between proximate memory elements. Note that although a Viterbi algorithm is disclosed, numerous other predictive estimation algorithms may be used. Also, the implementation of the Viterbi algorithm discussed herein is meant to be illustrative and may vary based on the system on which it is being implemented.

Figure 4A:
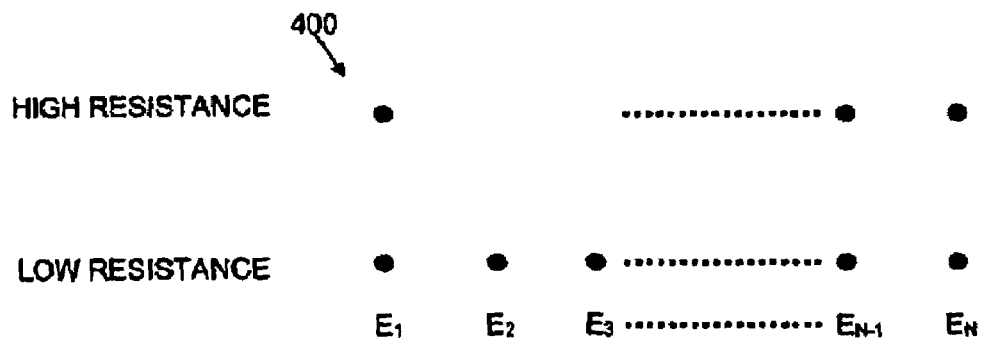
FIG. 4A shows a two-state trellis in accordance with various embodiments.

FIG. 4A shows a two-state trellis 400 illustrating the use of a Viterbi algorithm in decoding a memory array. Memory elements may be sequentially read from $E_1$ to $E_N$, where the resistance at each memory location may be estimated as being a high resistance or a low resistance. A high resistance may represent a binary '1' value whereas a low resistance may represent a binary '0' value, or vice-versa. For the sake of this disclosure, memory elements are discussed representing two possible values, but in general, memory elements may represent any plurality of bits—i.e., two or more. For example memory element $E_1$ may represent two bits with four possible resistance values (e.g., corresponding to 00, 01, 10, 11), and so a four-state trellis would be useful in this situation.

Figure 4B:
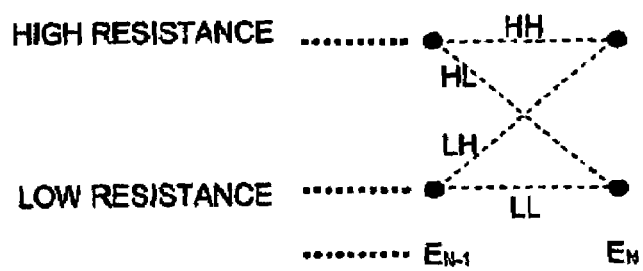
FIG. 4B shows various transitions in the trellis of FIG. 4A in accordance with various embodiments.

FIG. 4B illustrates the memory elements $E_{N-1}$ and $E_N$ of trellis 400 of FIG. 4A and the possible transitions associated in transitioning from $E_{N-1}$ to $E_N$. If memory element $E_{N-1}$ is estimated to be a high resistance, memory element $E_{N-1}$ may have two possible transitions to $E_N$. That is, $E_N$ may either be estimated as a high resistance or a low resistance, so that in going from $E_{N-1}$ to $E_N$, there may be a high-to-high (HH) transition or a high-to-low (HL) transition designated by the dashed lines in FIG. 4B as HH and HL, respectively. Alternatively, if memory element $E_{N-1}$ is estimated to be a low resistance, memory element $E_{N-1}$ may also have two possible transitions going to $E_N$. Again, $E_N$ may either be estimated as a high resistance or a low resistance, so that in going from $E_{N-1}$ to $E_N$, there may be a low-to-high (LH) transition or a low-to-low (LL) transition designated by the dashed lines in FIG. 4B as LH and LL respectively.

In transitioning between memory elements, an expected value $\mu_x$ may be computed for each transition (where x is HH, HL, LH, or LL). An error-term, $\in_x$, represents the difference between the resistive measurement of the memory element and the expected value $\mu_x$. Error-terms may be developed for each possible transition. By squaring the error-term and associating it with each possible transition, a cumulative history of error-squared-terms may be developed. Predictive values may be determined that correlate to a resistance measurement by choosing the path through the trellis with the minimum total error-squared.

High-to-High (HH). The expected value $\mu_{HH}$ is given in Equation (1) below as the average of the value measured for memory element $E_N$ and the value measured for $E_{N-1}$—where the values measured may represent resistances, inductances, capacitances:

$$\mu_{HH} = \frac{E_N + E_{N-1}}{2} \quad (1)$$

The error-term is the measured value of the resistance at a node N minus the expected value $\mu_{HH}$ as shown in Equation (2).

$$\epsilon_{HH} = E_N - \mu_{HH} = \frac{E_N - E_{N-1}}{2} \quad (2)$$

The error-squared-term is shown in Equation (3).

$$\epsilon_{HH}^2 = \frac{E_D^2}{4}; \text{where } E_D = E_N - E_{N-1} \quad (3)$$

Low-to-Low. The error-squared-term for the LL case may be shown to be symmetric with respect to the HH case.

$$\epsilon_{LL}^2 = \epsilon_{HH}^2 = \frac{E_D^2}{4} \quad (4)$$

Low-to-High. An approximation for the expected value $\mu_{LH}$ for an LH transition may be given in Equation (5) as the average value between the resistance of memory element N and the resistance of memory element N-1 modified by a global variation $\Delta$. The global variation may be calculated as shown in Equation (6).

$$\mu_{LH} \approx \frac{E_N + E_{N-1}}{2} \cdot (1 + \Delta) \quad (5)$$

$$\Delta = \frac{(E_H - E_L)}{(E_H + E_L)} \quad (6)$$

Note that the $E_H$ and $E_L$ terms in Equation (6) represent global averages of the high and low resistances respectively. The LH error-term may be the value of the resistance at node N minus the expected value $\mu_{LH}$ as shown in Equation (7).

$$\epsilon_{LH} = E_N - \mu_{LH} = \frac{E_N - E_{N-1}}{2} - \frac{(E_N + E_{N-1}) \cdot \Delta}{2} \quad (7)$$

The error-squared-term for the LH transition is shown in Equation (8).

$$\epsilon_{LH}^2 = \frac{E_D^2}{4} - \frac{\Delta \cdot E_D \cdot E_S}{2} + \frac{\Delta^2 \cdot E_S^2}{4}; \text{ where,} \quad (8)$$

$$E_D = E_N - E_{N-1} \text{ and } E_S = E_N + E_{N-1}$$

High-to-Low. Similarly, the LH transition case may be used to develop the error-squared-term for the High-to-Low (HL) case, as shown in Equation (9).

$$\epsilon_{HL}^2 = \frac{E_D^2}{4} - \frac{\Delta \cdot E_D \cdot E_S}{2} + \frac{\Delta^2 \cdot E_S^2}{4}; \text{ where,} \quad (9)$$

$$E_D = E_N - E_{N-1} \text{ and } E_S = E_N + E_{N-1}$$

Figure 4C:
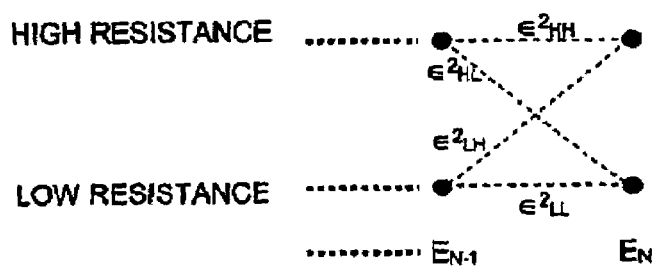
FIG. 4C shows error-squared-terms associated with the transitions of FIG. 4B in accordance with various embodiments.

FIG. 4C illustrates error-squared-terms associated with the two-state trellis shown in FIG. 4B. The maximum likely path according to the Viterbi decoding algorithm is the path through the trellis that minimizes the total sum of the error-squared-terms associated with each path transition. Thus, in reading each memory element, previous bit state information can be used to predict the next possible bit state in the next memory element read. Traditionally, memory elements that are read comprise a memory word and are usually sequentially proximate to each other—e.g., a memory read may entail reading memory elements of a single row in the array. However, reading the memory elements according to some of the embodiments does not require the memory elements be part of the same row or column in memory in order to achieve the desired effect. For example, in determining a value for memory element 15E in FIG. 1, the proximate memory elements 15A-D and 15F-I may be used to provide a maximum likelihood value. An example will now be provided to show the application of a Viterbi algorithm to a two-state trellis, with the understanding that this example is merely illustrative and should not be construed as limiting the scope of the claims in any way.

Figure 5A:
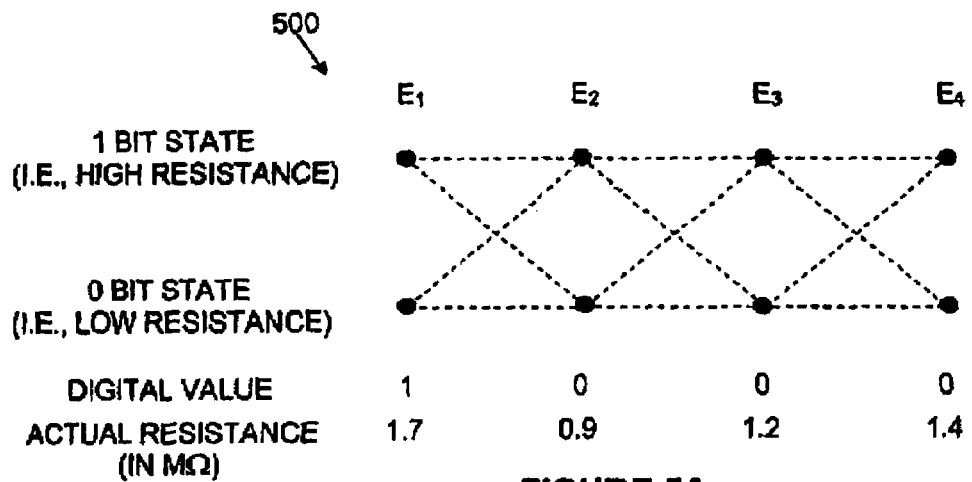
FIG. 5A shows an illustrative example in accordance with various embodiments.

Illustrative Example. Solely by way of a non-limiting example, FIG. 5A shows a two-state trellis 500 with memory elements having two possible bit states, that is, a binary '1' value or a binary '0' value. The memory elements may comprise magnetic memory elements such that the measured resistance of each element in a binary '1' bit state is ideally 2Ω, and the measured resistance of each element in a binary '0' bit state is ideally 1Ω. Due to inefficiencies, the actual values of the resistances may vary randomly from the ideal values. Suppose, for example, that there are four memory elements 1-4 that have binary values of 1, 0, 0, and 0 respectively, and measured resistance values representing the binary values are 1.7, 0.9, 1.2, and 1.4Ω respectively.

Figure 5B:
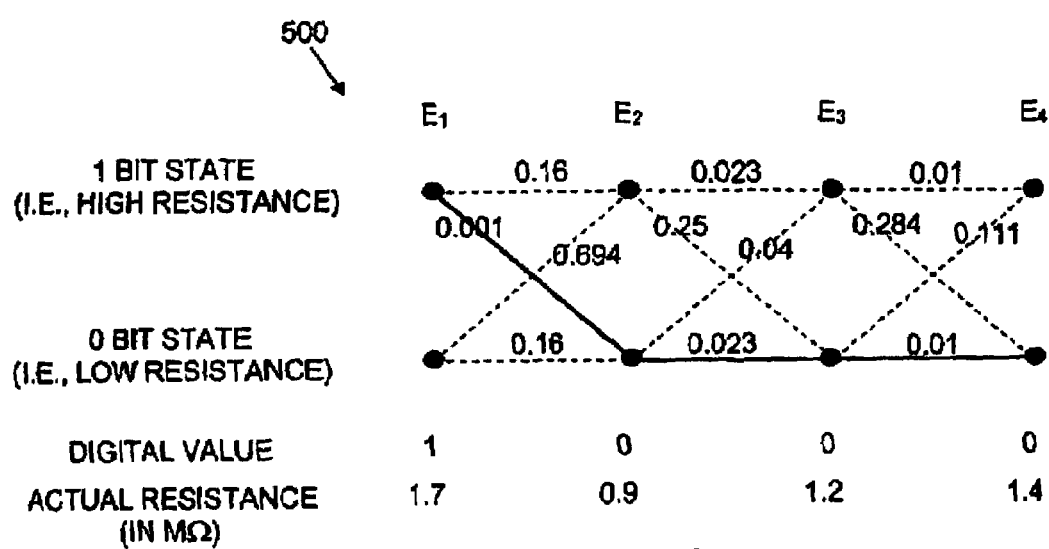
FIG. 5B shows calculations for the example of FIG. 5A in accordance with various embodiments.

Applying Equations (3), (4), (8), and (9), the error-squared-terms may be calculated as shown in FIG. 5B. Because there are four memory elements, there are $2^4$ possible paths through trellis 500. Deductions may be made during calculations using the error-squared-terms to reduce the possible number of paths to be considered. Reduction of all the possible paths to one single path is termed "closure". In the example shown in FIG. 5B, if the error-squared-terms are calculated for each possible path, the path with the lowest sum of error-squared-terms (indicated by the solid lines) would be the path that estimates memory elements 1-4 as having binary values of 1, 0, 0, and 0 respectively.

Initialization Techniques

In some situations, the data patterns read from successive memory elements may contain the same digital value (e.g., 1111 . . .) Consequently, some predictive estimation embodiments (e.g., Viterbi) may not achieve closure until the end of the memory word. Because $2^N$ (where N is the number of bits in the data word) possible paths may exist which need to be checked in order to determine the path that minimizes the sum of error-squared-terms, it may be desirable to induce closure sooner. Adverse effects of closure not occurring until the end of the data to be estimated include increases to processing power and time required to determine the contents of the memory. Thus, some embodiments of the present invention may force closure using initialization techniques and/or coding techniques.

Referring to the example shown in FIG. 5B and its error-squared-terms, if it is known that memory location 2 is in a binary '0' bit state (e.g., by initializing its value to binary '0'), then there are two possible paths from memory location 1 to memory location 2, and therefore two possible values for memory location 1. One possible transition in going from memory location 1 to memory location 2 is a High to Low (HL) transition, or memory location 1 set at a binary '1' bit state. Another possible transition in going from memory location 1 to memory location 2 is a Low to Low (LL) transition, or memory location 1 set at binary '0' bit state. Because the error term associated with the LL transition (i.e., memory location 1 at a binary '0' bit state) would increase the total sum of error terms, and the error term associated with the HL transition (i.e., memory location 1 at a binary '1' bit state) would decrease the sum of error terms, memory location 1 the predicted value for memory location 1 would be 1, as is the case in this example.

In some embodiments, an additional memory element may be included so that it may be initialized to prevent sequential memory elements with the same value. The actual value of the additional memory element may be set and interpreted in many ways. One method of doing this is by performing an OR function on the memory elements and storing the result of the OR function in the additional memory element. Accordingly, the additional memory element may be set to a binary '0' bit state if the memory elements contain all binary '0' values, or may be set to a binary '1' bit state if the memory elements contain all binary '1' values. Thus, in the event that predictive estimations determine two equally possible paths (which may be the case when the memory elements contain the same values), then the additional memory element may be checked to determine the value of the memory elements. That is, the memory elements may contain all 1s if the value of the additional memory element is set to a binary '1' by the OR function, or memory elements may contain all 0s if the value of the additional memory element is set to binary '0' by the OR function.

In other embodiments, an additional memory element may be used to initialize the predictive estimation algorithm. For example, the additional memory element may be written to with a predetermined value. The resistance representing the predetermined value may be measured and used to gauge the resistive values of other proximate memory elements.

In yet other embodiments, the data may be encoded prior to being written to the memory elements in order to facilitate decoding stored data. Numerous coding schemes exist which may be used. One example is an "$\%^{ths}$-coding" scheme in which an 8 bit data word is encoded as a 9 bit codeword. Of the 512 possible 9 bit codewords, only 256 are needed to encode an 8 bit data word. This allows the codewords to be chosen so as to have some desirable property, such as, for example, inserting at least one transition between proximate bits.

Note that there is no required ratio between the number of additional memory elements used for initialization and the number of memory elements used for storing data. Accordingly, some embodiments may achieve higher performance if at least one additional memory element is used for initialization purposes when each data word is stored. Also, the location of the additional memory element within the array of memory elements may be dynamic, and may be selected to further optimize proximity-improved reading algorithms. For example, if the memory array contains a resistive skew having a known gradient (e.g., from a manufacturing problem), then the additional memory element may be dynamically located within the memory array to maximize the memory-reading algorithm's response to known gradients, while minimizing the total number of additional memory elements used.

Some of the embodiments may eliminate the practice of "destructive reading". Destructive reading refers to the practice of a) buffering the resistance associated with the value stored in a memory element; b) storing a predetermined value in the memory element—which destroys the current value; and c) measuring the memory element's resistance associated with the predetermined value. If the values associated with the memory element's values are not known beforehand, then it may be necessary to perform a destructive read in order to determine the resistive values. In some embodiments, predictive estimations can be made for the values without destructive reading by using the proximate memory elements as a reference.

Note that while the embodiments disclosed herein (and their equivalents) may be employed in a memory, this memory may be further employed in any electronic device. More particularly this memory may be included in a computer comprising a processor that may be coupled to the memory. Also, the embodiments shown in FIGS. 2, 3, and/or 5 for interpreting the digital values of memory elements may be simultaneously used in a memory. For example, some portions of memory may benefit from utilizing the predictive methods of FIG. 5 while other portions of the same memory may benefit from utilizing the encoding methods of FIG. 3. Alternatively, one method may be used to verify the validity of other methods, for example, the predictive methods of FIG. 5 may be used to verify proper operation of the adaptive threshold embodiments shown in FIG. 2.

Figure 6:
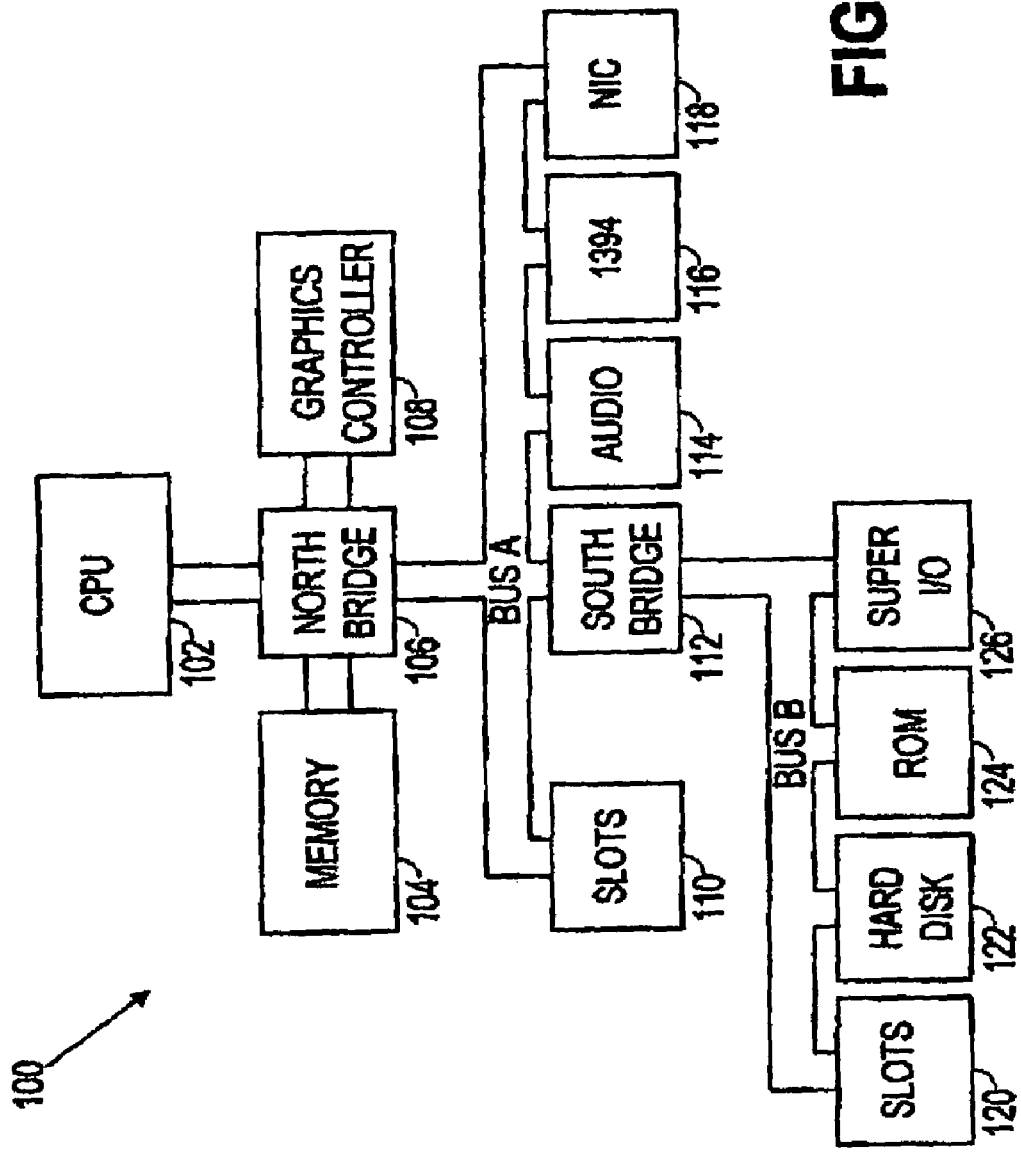
FIG. 6 shows a computer system in accordance with the various embodiments.

The memory disclosed herein, and the methods for controlling current in memory write lines may be used in a computer system. FIG. 6 illustrates an exemplary computer system 100. The computer system of FIG. 6 includes a CPU 102 that may be electrically coupled to a bridge logic device 106 via a CPU bus. The bridge logic device 106 is sometimes referred to as a "North bridge." The North bridge 106 also electrically couples to a main memory array 104 by a memory bus, and may further electrically couple to a graphics controller 108 via an advanced graphics processor (AGP) bus. Note that the main memory array 104 may be a magnetic memory array utilizing the disclosed methods for controlling the write line current. The North bridge 106 couples CPU 102, memory 104, and graphics controller 108 to the other peripheral devices in the system through, for example, a primary expansion bus (BUS A) such as a PCI bus or an EISA bus. Various components that operate using the bus protocol of BUS A may reside on this bus, such as an audio device 114, a IEEE 1394 interface device 116, and a network interface card (NIC) 118. These components may be integrated onto the motherboard, as suggested by FIG. 6, or they may be plugged into expansion slots 110 that are connected to BUS A.

If other secondary expansion buses are provided in the computer system, another bridge logic device 112 may be used to electrically couple the primary expansion bus (BUS A) to the secondary expansion bus (BUS B). This bridge logic 112 is sometimes referred to as a "South bridge." Various components that operate using the bus protocol of BUS B may reside on this bus, such as a hard disk controller 122, a system ROM 124, and Super I/O controller 126. Slots 120 may also be provided for plug-in components that comply with the protocol of BUS B.

For an example of an alternate embodiment, please refer now to FIG. 7. FIG. 7 is a flowchart of a method in accordance with an alternate embodiment. Step 701 includes measuring values associated with a plurality of memory elements, wherein the values are indicative of a digital state. Step 702 includes calculating a plurality of terms associated with transitions in the values between memory elements wherein calculating includes calculating a sum of terms associated with transitions. Step 703 involves determining the digital state of at least one memory element using the calculations from step 702 by determining the digital states of a memory word by choosing an outcome that minimizes the sum of transition-terms.

The above discussion is meant to be illustrative of the principles and various embodiments of the present invention. Numerous variations and modifications will become apparent to those skilled in the art once the above disclosure is fully appreciated. Accordingly, aspects of the embodiments may be combined together in various forms to achieve desirable results. For example, the adaptive threshold techniques may be employed in the Viterbi memory-decoding algorithm to produce an adaptive threshold value for reading the memory elements. Also, the memory elements shown may be oriented in any fashion are not limited to single bit memory arrays in that there may be multiple bit memory elements arranged in a non-array fashion. It is intended that the following claims be interpreted to embrace all such variations and modifications.

What is claimed is:

1. A method, comprising the acts of:
   (a) measuring values associated with a plurality of memory elements, wherein the values are indicative of a digital state;
   (b) calculating a sum of a plurality of terms associated with transitions in the values between proximate memory elements; and (c) determining the digital state of at least one memory element using the calculations from (b) comprising determining the digital states of a memory word by choosing an outcome that minimizes the sum of transition-terms.

2. The method of claim 1, wherein the proximate memory elements have observed values that vary due to processing inefficiencies.

3. The method of claim 1, further comprising initializing the plurality of memory elements to limit the length of repetitive digital states.

4. The method of claim 3, wherein initialization includes allocating at least one additional memory element.

5. The method of claim 3, wherein initialization includes encoding the plurality of memory elements.

6. The method of claim 1, wherein the memory elements comprise magnetic memory elements.

7. The method of claim 6, wherein the values measured in (a) represent resistive values.

8. A memory, comprising:
a plurality of memory elements;
circuitry coupled to the plurality of memory elements wherein the circuitry includes a comparison device and a register, wherein the comparison device compares the contents of the register to determine the digital state of a desired memory element and wherein the contents of the register represent an adaptive threshold that is modified to reflect previous determinations of previous memory elements; and
wherein the circuitry observes values of a plurality of memory elements corresponding to digital states, and utilizes the observed values to determine the digital state of at least one memory element.

9. The memory of claim 8, wherein the observed values are used to calculate a plurality of transition-terms associated with possible transitions between proximate memory elements.

10. The memory of claim 9, wherein the proximate memory elements have observed values that vary due to processing inefficiencies.

11. The memory of claim 9, wherein the plurality of transition-terms are used to determine the digital state of a memory word.

12. The memory of claim 11, wherein the plurality of memory elements are initialized to limit the length of repetitive digital states.

13. The method of claim 12, wherein initialization includes allocating at least one additional memory element 14. The memory of claim 12, wherein initialization includes encoding the data using an $8/9^{ths}$ code, in which an 8 bit data word is encoded as a 9 bit code word.

15. The method of claim 8, wherein the memory elements comprise magnetic memory elements.

16. The method of claim 15, wherein the observed values represent resistive values.

17. A computer, comprising:
a processor;
a memory coupled to the processor, wherein the memory further comprises a plurality of memory elements; circuitry coupled to the plurality of memory elements wherein the circuitry includes a comparison device and a register, wherein the comparison device compares the contents of the register to determine the digital state of a desired memory element and wherein the contents of the register represent an adaptive threshold that is modified to reflect previous determinations of previous memory elements; and wherein the circuitry observes values of a plurality of memory elements corresponding to digital states, and utilizes the values of proximate memory elements to predict the digital state of at least one memory element.

18. The computer of claim 17, wherein the values are used to calculate a plurality of transition-terms associated with the possible transitions between proximate memory elements.

19. The memory of claim 18, wherein the proximate memory elements have observed values that vary due to processing inefficiencies.

20. The computer of claim 18, wherein the plurality of transition-terms are used to determine the digital state of a memory word.

21. The computer of claim 17, wherein the memory elements comprise magnetic memory elements.

22. The computer of claim 21, wherein the values observed represent resistive values.

* * * * *

UNITED STATES PATENT AND TRADEMARK OFFICE
CERTIFICATE OF CORRECTION

PATENT NO. : 7,467,264 B2
APPLICATION NO. : 10/607624
DATED : December 16, 2008
INVENTOR(S) : Richard L. Hilton et al.

It is certified that error appears in the above-identified patent and that said Letters Patent is hereby corrected as shown below:

In column 2, line 16, delete "of method in a accordance" and insert -- of a method in accordance --, therefor.

In column 7, line 36, in equation 9, delete " $\epsilon_{HL}^2 = \dfrac{E_D^2}{4} - \dfrac{\Delta \cdot E_D \cdot E_S}{2} + \dfrac{\Delta^2 \cdot E_S^2}{4}$ " and insert -- $\epsilon_{HL}^2 = \dfrac{E_D^2}{4} + \dfrac{\Delta \cdot E_D \cdot E_S}{2} + \dfrac{\Delta^2 \cdot E_S^2}{4}$ --, therefor.

In column 12, line 5, in Claim 13, delete "element" and insert -- element. --, therefor.

Signed and Sealed this

Twenty-third Day of June, 2009

JOHN DOLL
*Acting Director of the United States Patent and Trademark Office*